United States Patent [19]

Rose et al.

[11] Patent Number: 4,623,794
[45] Date of Patent: Nov. 18, 1986

[54] PARTICLE BEAM BLANKING SYSTEM

[75] Inventors: Harald Rose, Prinz-Christian-Weg 5a, D6100-Darmstadt; Joachim Zach, Nauheim, both of Fed. Rep. of Germany

[73] Assignee: Harald Rose, Darmstadt, Fed. Rep. of Germany

[21] Appl. No.: 612,850

[22] Filed: May 22, 1984

[30] Foreign Application Priority Data

Dec. 22, 1983 [DE] Fed. Rep. of Germany ... 8336881[U]

[51] Int. Cl.⁴ ............................................. H01J 3/26
[52] U.S. Cl. ............................ 250/396 R; 250/505.1
[58] Field of Search .................... 250/396 R, 505.1

[56] References Cited

U.S. PATENT DOCUMENTS 4,277,679 7/1981 Feuerbaum .
4,445,041 4/1984 Kelly et al. ................. 250/396 R

FOREIGN PATENT DOCUMENTS 55-155455 12/1980 Japan ........................... 250/396 R
58-4255 1/1983 Japan ............................ 250/396 R

OTHER PUBLICATIONS

Feuerbaum et al., "Application of Electron Beam Measuring Techniques . . . ", *Scanning Electron Microscopy*, vol. I, 1978, pp. 795–800.

*Primary Examiner*—Bruce C. Anderson
*Assistant Examiner*—Jack I. Berman
*Attorney, Agent, or Firm*—Hill, Van Santen, Steadman & Simpson

[57] ABSTRACT

In a corpuscular-optical beam path, the generation of short electron pulses with steep leading edges is to be effected without a probe movement in the probe plane taking place. For this purpose, the particle beam blanking system comprises at least two deflection systems and a knife edge arranged between two deflection systems in an intermediate image plane, the operating parameters of the deflection systems and the knife edge being matched to the energy distribution of the particles in such a fashion that shifting of the particle beam in the probe plane disappears.

4 Claims, 3 Drawing Figures

FIG 3

| G | Δt [ns] | Δ [ns] | ϑ | m [μm] |
|---|---|---|---|---|
| 0.75 | 4.996 | 5 | 75ps ≅ 1.5 % | 50 |
|  | 1.991 | 2 | 30ps ≅ 1.5 % | 49 |
|  | 0.9815 | 1 | 15ps ≅ 1.5 % | 46 |
|  | 0.777 | 0.8 | 12ps ≅ 1.5 % | 44 |
|  | 0.4644 | 0.5 | 7.7ps ≅ 1.5 % | 37 |
| 0.8 | 0.2933 | 0.3 | 6.2ps ≅ 2.1 % | 20 |
| 0.9076 |  | 0.2 | 8.4ps ≅ 4.2 % | 9 |
| 0.975 |  | 0.1 | 17ps ≅ 17 % | 2.2 |

PARTICLE BEAM BLANKING SYSTEM

BACKGROUND OF THE INVENTION

The invention relates to a particle beam blanking system according to the preamble of claim 1 and comprising deflection means for effecting the blanking of a particle beam.

For many particle beam apparatus, generation of short particle pulses with steep leading edges is necessary without a movement of the particle probe taking place in the image, or in the object plane, respectively. Particularly, in the area of electron beam measurement technique, for the purpose of carrying out stroboscopic methods, electron pulses with steep leading edges are necessary in order to obtain high chronological and local resolution in the case of analysis of test objects with rapidly variable operational data. A particle beam blanking system of the type initially cited can be advantageously employed, for example, in the case of an electron beam apparatus and in the case of a measurement method such as are described in U.S. Pat. No. 4,277,679.

In the case of the known stroboscopic electron beam apparatus according to the state of the art, a relatively simple plate deflection system is activated with blanking pulses as rectangular as possible. The problem of brief time-particle beam pulse generation was thus shifted to the construction of extremely rapid, electric pulse generators for the purpose of activation of the plate deflection system. A movement of the particle beam probe on the surface of a test object could thus not be avoided. The consequences thereof are a relatively poor chronological and local resolution during the analysis of processes, varying rapidly chronologically and spatially, on the surface of the test subject and, as the consequence of this, an impairment of measurement results. If, with the aid of stroboscopic measuring methods in the case of electron beam measuring technique, a surface (coated with a passivation layer) of an electronic component is to be examined, the movement of an electron beam probe on the passivation layer brings about an additional charge of said passivation layer, and hence an additional impairment of the measurement (or test) results.

Further background concerning the use of a scanning electron microscope for measuring the quantitative potential and waveform at a measuring location of an electronic component such as an integrated circuit is found in an article by Feuerbaum and Hernaut entitled "Application Of Electron Beam Measuring Techniques For Verification Of Computer Simulations For Large-Scale Integrated Circuits" in Scanning Electron Microscopy 1978, Vol. I, at pages 795–800.

SUMMARY OF THE INVENTION

The principal object underlying the invention, resides in disclosing a particle beam blanking system of the type initially cited with the aid of which the generation of brief electron pulses with steep rising edges is possible without a probe movement in the image thus taking place.

In accordance with the invention, this objective is achieved by a particle beam blanking system according to claim 1. Such a system may comprise a knife edge arranged in an intermediate image plane between two deflection systems, with the operating parameters being so matched to the energy distribution of the particles that shifting of the particle beam in a probe plane disappears.

In a method aspect of the invention, a particle beam is focused at an intermediate focal plane in advance of the probe plane, and a knife edge or other beam absorbing means is arranged spaced from the focused beam in the intermediate focal plane. During a blanking operation a deflection of the beam is effected in the focal plane toward the knife edge; this tends to shift the beam transmitted beyond the intermediate focal plane away from the point-like measurement region in the probe plane. At a time-delay corresponding to the transit time of the beam, a compensating deflection is progressively applied to the transmitted beam so that the transmitted beam continues to arrive essentially at the point-like measurement region until the transmitted beam has been completely blanked by the knife edge.

Embodiments and advantages of the invention are presented in the subclaims, the specification, and the drawings; and other objects, features and advantages will be apparent from this detailed disclosure and from the appended claims.

The proposed particle beam blanking system generates, for example, electron pulses with a pulse duration or width in the range of approximately 100 ps to 5 ns. The electron pulse is chronologically approximately rectangular. The rising edges of these electron pulses extend over a range of 1.5% to 20% of the electron pulse width depending upon electron pulse duration.

In the case of a particle beam blanking system according to the invention, a shift of the particle beam probe is avoided. It is particularly advantageous that the activation of the deflection plates in an inventive particle beam blanking system can proceed with electric pulses which need not have any steep rising edges. In Gaussian approximation, through the introduction of an inventive particle beam blanking system, a particle-optical beam path is not altered except for an inversion.

Although the invention shall be explained in greater detail with reference to an exemplary embodiment in the following on the basis of the drawing, it is emphasized that the invention is not restricted to the exemplary embodiments. On the contrary, what is important in terms of the invention is merely that a particle beam is deflected, that it is then imaged in an intermediate image plane, that, in said intermediate image plane, a knife edge blanks the particle beam, that the particle beam is then again deflected, and that the particle beam is finally imaged on the object plane. There are many possibilities of varying the means for beam generation, the means for beam deflection, the means for beam imaging, and the means for beam blanking in the framework of this invention such that a shifting of the particle beam probe in the probe plane is avoided every time.

BRIEF DESCRIPTION OF THE DRAWINGS

FIG. 3 shows a table with operating data of inventive particle beam blanking systems.

DETAILED DESCRIPTION

Figure 1:
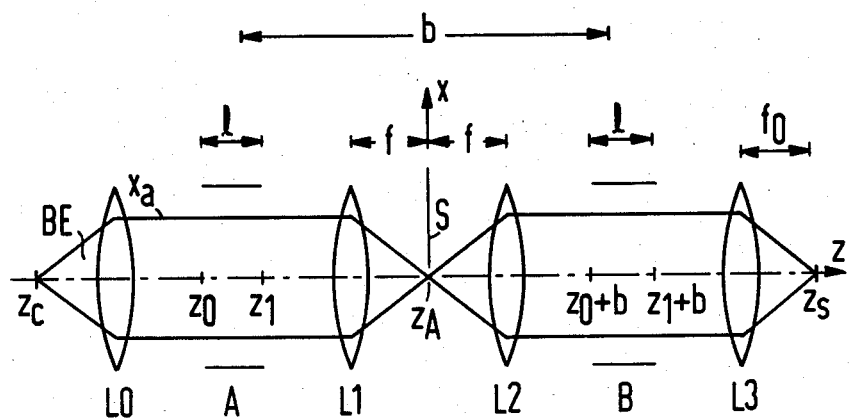
FIG. 1 shows a section from a corpuscular-optical beam path comprising an inventive particle beam blanking system.

FIG. 1 shows a section of a corpuscular-optical beam path comprising an inventive particle beam blanking system. In the exemplary embodiment according to FIG. 1, the particle beam blanking system consists of two electric deflection systems A and B, and two intermediately-connected thin magnetic lenses L1 and L2. The two thin magnetic lenses L1 and L2, each exhibit the same focal length f. In the center, between the two thin magnetic lenses L1 and L2, the intermediate image plane with the coordinate $Z_A$ is disposed which is generated by the first thin magnetic lens L1. For mathematical considerations made in the following, the coordinate $Z_A$ of this intermediate image plane is given the value 0. Symmetrically to said coordinate $Z_A$ are disposed the two electric deflection systems A and B, which exhibit the same length l. In the intermediate image plane with the coordinate $Z_A$ a knife edge S for blanking the particle beam BE is arranged.

The inventive particle beam blanking system according to FIG. 1 can, for example, be inserted in a telescopic beam path generated in a scanning electron microscope. As long as the deflection fields of the deflection system A and B are disconnected, the paraxial electron path $X_a$, originating from the center of the cross-over plane with the coordinate $Z_C$, after passage of said electron path $X_a$ through a first collimating lens L0, strikes the focusing lens L1, traverses the intermediate image plane with the coordinate $z_A$ in the center, is again deflected by the magnetic lens L2 to a paraxial corpuscular path and finally, after passage through the focusing objective lens L3, strikes in the center of the probe plane with the coordinate $Z_S$. The objective lens L3 possesses a focal length $f_0$.

The second deflection system B is rotated in relation to the first deflection system A corresponding to Larmor rotation as the consequence of the intermediately disposed lenses L1 and L2. The beginning of the deflection system B exhibits a distance b in relation to the beginning of the deflection system A. The length l of the deflection system A extends between the coordinates $Z_0$ and $Z_1$. The length l of the deflection system B extends between the coordinates $Z_0+b$ and $Z_1+b$. The deflection system B is activated in a phase-shifted fashion in relation to the deflection system A. The shift time between the mutually corresponding activation times of the two deflection systems A, B, corresponds to the transit time of the particles from the beginning of the deflection system A to the beginning of the deflection system B. The steep chronological rising edges of the pulsed spot in the probe plane with the coordinate $Z_S$ are achieved through the blanking of the particle beam in the intermediate image plane with the coordinate $Z_A$. Thus, the rise time $\theta$ of a corpuscular pulse corresponds to that time which is necessary in order to deflect [or shift] the intermediate image in the intermediate image plane with the coordinate $Z_A$ beyond the edge of the knife edge S.

In order to achieve small deflection angles during the deflection of the particle beam there is superimposed on each of the chronologically variable deflection fields $\tilde{g}$, a chronologically constant deflection field G. For pulse widths $\Delta t$ which are smaller than the transit time $T_A$ of the particles in the first deflection field A, it is advantageous to regulate the effective corpuscular pulse width $\Delta$ via the amplitude of the chronologically constant deflection field G at said deflection system A. This possibility of regulation of the effective pulse width $\Delta$ via the control of the amplitude G of the chronologically constant deflection field at the deflection system A is apparent from the table in FIG. 3.

An inventive particle beam blanking system makes it possible for the migration $x_S$ of the particle beam probe in the probe plane with the coordinate $z_S$ to disappear. This migration $x_S$ is thus defined as follows:

$$x_S \sim \int_{z_C}^{z_S} \phi_1(z,t) \cdot x_a(z) dz \quad (1)$$

In this formula (1), $\phi_1$ is the electric deflection field at the z-axis; $x_a$ is the paraxial corpuscular path, emanating from the center of the cross-over plane with the coordinate $z_C$, in the case of a disconnected (zero) deflection field; and t is the time coordinate. The corpuscular path $x_a$ runs, in the region of the deflection systems A, B, in the case of disconnected deflection fields, parallel to the optical axis insofar as it is described in the reference system rotated with the larmor rotation which is brought about by the magnetic lenses. The chronologically and spatially variable deflection field $\phi_1$ (z,t), as a product of a chronologically constant and spatially variable deflection field $\phi_1$ (z) and a non-dimensional, spatially constant and chronologically variable function $\tilde{g}$ (t), can be described as follows:

$$\phi_1(z,t) = \phi_1(z) \cdot \tilde{g}(t) \quad (2)$$

With the velocity $v_o$ of the particles the non-dimensional function $\tilde{g}$ (t) can be represented as $\tilde{g}$ ($z/v_o$).

Figure 2:
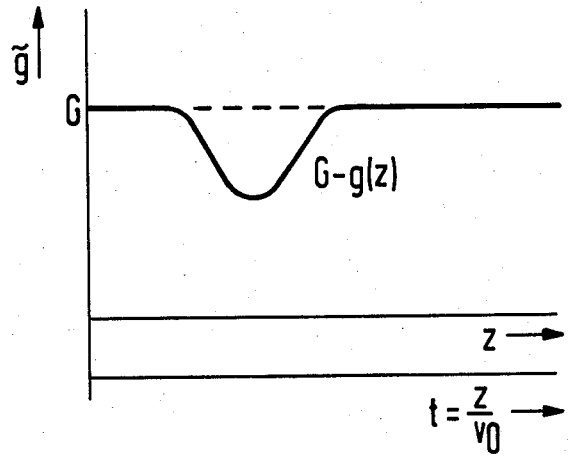
FIG. 2 explains the activation of a deflection system.

FIG. 2 explains the progression of the function $\tilde{g}$ ($z/v_o$). The function $\tilde{g}$ ($z/v_o$) consists of two parts:

$$\tilde{g}(z/v_o) = G - g(z) \quad (3)$$

G describes herein a chronologically constant deflection field and g(z) describes the chronologically variable electric pulse for the activation of the deflection system A, B, whereby a particle with the velocity $v_o$ undergoes this chronologically variable deflection field as a spatially variable deflection field. In the following, the function g(z) is to have the pulse amplitude one (1). Then the constant G characterizes the ratio of the value of the constant deflection field to the pulse amplitude of the chronologically variable deflection field.

Thus, for the exemplary embodiment according to FIG. 1, as a condition for the disappearance of the probe migration $x_S$ in the probe plane with the coordinate $z_S$ the following results:

$$x_S \sim \int_{z_0}^{z_1} \phi_{1A}(z) \cdot (G - g_A(z)) x_{aA} dz + \int_{z_0+b}^{z_1+b} \phi_{1B}(z)(G - g_B(z))x_{aB} dz = 0. \quad (4)$$

Index A relates to the values of the respective quantities in the region of the deflection system A. Index B relates to the values of the respective quantities in the region of the deflection system B.

The probe migration $x_S$ disappears, for example, when the following three equations are simultaneously satisfied:

$$\phi_{1B}(z+b) = \phi_{1A}(z), \quad (5)$$

$$g_B(z+b) = g_A(z), \quad (6)$$

$$x_{aA} = -x_{aB} \quad (7)$$

The first of these three equations relates to the symmetry of the deflection systems A, B; the second of these three equations relates to an activation of the two deflection systems A, B, with the phase shift $\tau = b/v_o$; and the third of these three equations, finally, relates to a 1:1 imaging by the two magnetic lenses L1, L2. The two magnetic lenses L1, L2 can, of course, also be replaced by a corresponding thick lens.

FIG. 3 shows a table with operating data for an examplary embodiment according to FIG. 1. The following parameters were assumed:

$$\phi_1 = \begin{cases} -50 \text{ V/cm for } z_0 \leq z \leq z_1, z_0 + b \leq z \leq z_1 + b, \\ 0 \text{ otherwise} \end{cases}$$

Energy of the electrons as particles: $e\phi_o = 2.5$ keV,
Length of a deflection system: $l = z_1 - z_o = 1$ cm,
Probe diameter in the probe plane: $d_S = 0.3$ μm,
Focal length of the objective lens L3: $f_o = 2$ mm,
Focal length of the intermediate lenses: $f = 1$ cm.

The knife edge S is to be disposed at a distance of 25 μm in the positive x-direction above the z-axis. For the chronologically variable activation pulse of the deflection systems a bell-shaped progression or curve as a function of time is assumed because such a bell-shaped progression exhibits $$g(t) = \frac{t_o^2}{t^2 + t_o^2} = \frac{\beta^2}{(z - \xi)^2 + \beta^2} = g(z) \quad (9)$$

relatively flat leading edges. $\xi$ designates the place at which a specific electron is disposed at the time $t=0$. Since these electrons successively reach the probe plane with the coordinate $z_S$, $\xi/v_o$, except for an additive constant, is also a measure of the time at which the electrons reach the probe plane.

The deflection x (z) in the intermediate image plane with the coordinate $z_A = 0$ results at $$x(o) = \frac{x_\gamma(0)}{2\phi_o} \int_{z_0}^{z_1} \phi_{1A}(z)(G - g(z))dz \quad (10)$$

$$= \frac{x_\gamma(0)}{2\phi_o} \int_{\left(-\frac{b}{2} - \frac{l}{2}\right)}^{\left(-\frac{b}{2} + \frac{l}{2}\right)} \phi_1 \cdot (G - g(z))dz.$$

The coordinates $z_o$ and $z_1$, as in FIG. 1, describe the beginning and the end of the deflection system A. The evaluation of this equation supplies the following expression:

$$x(o) = \frac{f \cdot \phi_1}{2 \cdot \phi_o} \left( \beta \arctan\left(\frac{l - b - 2\xi}{2\beta}\right) + \right. \quad (11)$$

$$\left. \beta \cdot \arctan\left(\frac{l + b + 2\xi}{2\beta}\right) - G \cdot l \right).$$

This expression can also be written as a function of the time t. With $b = \tau v_o$, $\beta = v_o \cdot \Delta t/2$ and $\xi = v_o t$, for the deflection x in the intermediate image plane, as a function of the time t, the following expression results:

$$x(z_A = o, t) = -\frac{f \cdot \phi_1}{4 \cdot \phi_o} \cdot v_o \cdot \Delta t \left( \frac{2 \cdot G \cdot l}{v_o \cdot \Delta t} - \right. \quad (12)$$

$$\left. \arctan\left(\frac{\frac{l}{v_o} - 2t - \tau}{\Delta t}\right) - \arctan\left(\frac{\frac{l}{v_o} + 2t + \tau}{\Delta t}\right) \right).$$

As long as the maximum distance m of the deflected electron beam from the edge of the knife edge S is greater than the diameter $d_A = d_S \cdot f/f_o$ of the intermediate image in the intermediate image plane with the coordinate $z_A$, the chronological leading edge of the electron pulse can be represented as $$\theta = \frac{d_A}{\left|\frac{\partial}{\partial t} \times (z = o, t)\right|} \quad (13)$$

$$= \frac{d_s}{f_o} \cdot \frac{\phi_o}{\phi_1 \cdot (\Delta t)^2} \cdot$$

$$\frac{[\Delta t^2 + (l/v_o)^2 + (2t + \tau)^2]^2 - 4l(l/v_o)^2(2t + \tau)^2}{2 \cdot l \cdot (2t + \tau)}.$$

The parameter t is that time is to be employed herein in which the intermediate image, after connection of the bell-shaped activation pulse $\bar{g}$, shifts beyond the edge of the knife edge S. With the above indicated values for the individual parameters in this expression, the values shown in FIG. 3 result for the width $\Delta t$ of the bell-shaped activation pulse, the measured effective pulse width $\Delta$ for the electron beam, the slope $\theta$ of the leading edge of the electron pulse: , and for the maximum distance m of the intermediate image from the edge of the knife edge S, given a specified amplitude G for the chronologically constant deflection field.

In the first five lines in the table of FIG. 3 the amplitude of chronologically constant deflection field G exhibits the same value. Only the width $\Delta t$ of the bell-shaped activation pulse $\bar{g}$ of the deflection systems A, B is varied. In the last three lines in the table of FIG. 3, the pulse widths $\Delta t$ are smaller than the transit times TA of the electrons in the deflection field A. Accordingly, the effective pulse width $\Delta$ of the electron beam, in the examples according to these three last lines, is regulated by a control of the amplitude of the chronologically constant deflection field G. Even in the case of an effective pulse width $\Delta$ of the electron beam of 0.1 ns, the maximum distance m of the intermediate image from the edge of the knife edge S still amounts to 2.2 μm and is thus greater than the diameter $d_A$ of the intermediate image, which amounts to 1.5 μm for the selected parameters.

The table of FIG. 3 shows that an inventive system can supply, in a chronologically approximated fashion, rectangular corpuscular pulses with slopes $\theta$, depending upon the effective pulse duration $\Delta$, having 1.5% to 20% of the corpuscular effective pulse width $\Delta$. Thus, an excursion or shifting of the probe is avoided. The activation of the deflection plates proceeds with activation pulses $\bar{g}$ which need not have any steep leading edges. Though the introduction of an inventive particle beam blanking system the beam path behind the system is not altered in Gaussian approximation except for an inversion.

It will be apparent that many modifications and variations may be made without departing from the scope of the teachings and concepts of the present invention.

We claim as our invention:

1. A particle beam blanking system for a corpuscular-optical beam path, comprising at least two deflection systems, a knife edge arranged between two of the deflection systems in an intermediate image plane, and means whereby the operating parameters of the deflection systems and the knife edge are so matched to the energy distribution of the particles that shifting of the particle beam in a probe plane disappears during particle beam blanking operation, said two deflection systems being symmetrically disposed relative to the intermediate plane in which the knife edge is arranged, and a magnetic imaging system which, in the intermediate image plane, brings about a cross-over, whereby a second of said two deflection systems, in relation to the first of said two deflection systems is rotated corresponding to the Larmor rotation as a consequence of the intermediately disposed magnetic imaging system.

2. A particle beam blanking system according to claim 1, with said magnetic imaging system comprising first and second magnetic lenses, said first magnetic lens being disposed in advance of the knife edge with respect to the beam direction along the beam path and having focussing properties, and said second magnetic lens being disposed following the knife edge with respect to the beam direction along the beam path and having collimating properties, said first and second magnetic lenses being disposed symmetrically between said two deflection systems and being disposed symmetrically with respect to said knife edge.

3. A method for particle beam blanking in a blanking system for a corpuscular-optical beam travelling in a beam path, said blanking system having at least two deflection systems, a knife edge, a magnetic imaging system and a probe plane on which said particle beam is incident, said method comprising the steps of:

disposing said knife edge in an intermediate image plane in said beam path between two of said deflection systems;

matching the operating parameters of said two deflection systems and said knife edge to the energy distribution of the particles in the beam so that shifting of the particle beam in said probe plane disappears during beam blanking;

generating a cross-over of said beam by said magnetic imaging system in said intermediate image plane; and rotating a second of said two deflection systems in the direction of particle travel relative to a first of said deflection systems corresponding to the Larmor rotation in dependence on said magnetic imaging system.

4. A method as claimed in claim 3, wherein said magnetic imaging system has first and second magnetic lenses, and comprising the additional steps of:

disposing said first and second magnetic lenses respectively in advance of and following said knife edge in the direction of particle travel symmetrically with respect to said knife edge and symmetrically between said two deflection systems;

focussing said particle beam with said first magnetic lens; and collimating said particle beam with said second magnetic lens.

* * * * *